(12) United States Patent
Kim et al.

(10) Patent No.: US 11,825,686 B2
(45) Date of Patent: *Nov. 21, 2023

(54) DISPLAY APPARATUS INCLUDING A PERIPHERAL CRACK DETECTION CIRCUIT

(71) Applicant: Samsung Display Co., Ltd., Yongin-si (KR)

(72) Inventors: Hun Kim, Yongin-si (KR); Changhyun Ko, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/943,194

(22) Filed: Sep. 12, 2022

(65) Prior Publication Data

US 2023/0070438 A1 Mar. 9, 2023

Related U.S. Application Data

(63) Continuation of application No. 16/929,334, filed on Jul. 15, 2020, now Pat. No. 11,444,264, which is a
(Continued)

(30) Foreign Application Priority Data

Oct. 26, 2018 (KR) .................. 10-2018-0129286

(51) Int. Cl.
*H10K 50/844* (2023.01)
*H10K 59/122* (2023.01)
(Continued)

(52) U.S. Cl.
CPC ......... *H10K 50/844* (2023.02); *H10K 59/122* (2023.02); *H10K 71/00* (2023.02); *H10K 77/111* (2023.02)

(58) Field of Classification Search
None
See application file for complete search history.

(56) References Cited

U.S. PATENT DOCUMENTS 9,825,056 B2 11/2017 Kwak et al.
9,842,894 B2 12/2017 Oh et al.
(Continued)

FOREIGN PATENT DOCUMENTS

KR 10-2016-0097449 A 8/2016
KR 10-2016-0124301 A 10/2016
(Continued)

OTHER PUBLICATIONS

Notice of Allowance dated Mar. 17, 2020, in U.S. Appl. No. 16/573,018.
(Continued)

*Primary Examiner* — J. E. Schoenholtz
(74) *Attorney, Agent, or Firm* — H.C. Park & Associates, PLC

(57) ABSTRACT

A display apparatus including a substrate; a display area arranged on the substrate and including a plurality of pixels, and a peripheral area arranged outside the display area; a dam surrounding the display area; a crack detector arranged between the dam and an end of the substrate and electrically connected to at least one of the plurality of pixels; a crack prevention dam arranged between the dam and the end of the substrate; and an encapsulation layer including a first inorganic layer, an organic layer, and a second inorganic layer, each covering the display area and a portion of the peripheral area. The first inorganic layer and the second inorganic layer in the encapsulation layer extend to the end of the substrate.

19 Claims, 10 Drawing Sheets

Related U.S. Application Data continuation of application No. 16/573,018, filed on Sep. 17, 2019, now Pat. No. 10,720,604.

(51) Int. Cl.
  *H10K 71/00* (2023.01)
  *H10K 77/10* (2023.01)

(56) References Cited

U.S. PATENT DOCUMENTS

| | | | |
|---|---|---|---|
| 10,026,793 B2 | 7/2018 | Jeon | |
| 10,720,604 B2 | 7/2020 | Kim et al. | |
| 11,444,264 B2* | 9/2022 | Kim | H10K 50/8445 |
| 2012/0146492 A1 | 6/2012 | Ryu et al. | |
| 2012/0208306 A1 | 8/2012 | Haas et al. | |
| 2016/0141551 A1* | 5/2016 | Seo | H10K 50/8445 |
| | | | 257/40 |
| 2016/0284785 A1 | 9/2016 | Matsuura et al. | |
| 2016/0307971 A1 | 10/2016 | Jeon | |
| 2017/0005293 A1 | 1/2017 | Kim et al. | |
| 2017/0149017 A1 | 5/2017 | Lee et al. | |
| 2017/0331058 A1 | 11/2017 | Seo | |
| 2018/0090517 A1 | 3/2018 | Park et al. | |
| 2018/0102502 A1 | 4/2018 | Kim et al. | |
| 2018/0308903 A1 | 10/2018 | Jeong et al. | |
| 2019/0131572 A1 | 5/2019 | Gwon et al. | |
| 2019/0363275 A1 | 11/2019 | Ochi et al. | |
| 2019/0386249 A1 | 12/2019 | Cai | |
| 2020/0006714 A1 | 1/2020 | Zhang et al. | |
| 2020/0091459 A1 | 3/2020 | Senoo et al. | |
| 2020/0395573 A1 | 12/2020 | Zhang et al. | |
| 2021/0359069 A1* | 11/2021 | Wang | H10K 77/10 |

FOREIGN PATENT DOCUMENTS

| | | |
|---|---|---|
| KR | 10-2017-0003297 A | 1/2017 |
| KR | 10-2018-0035288 A | 4/2018 |
| KR | 10-2018-0039801 A | 4/2018 |
| KR | 10-2018-0119198 A | 11/2018 |

OTHER PUBLICATIONS

Non-Final Office Action dated Jan. 26, 2022, in U.S. Appl. No. 16/929,334.

Notice of Allowance dated May 5, 2022, in U.S. Appl. No. 16/929,334.

* cited by examiner

DISPLAY APPARATUS INCLUDING A PERIPHERAL CRACK DETECTION CIRCUIT

CROSS-REFERENCE TO RELATED APPLICATION

This application is a Continuation of U.S. patent application Ser. No. 16/929,334, filed Jul. 15, 2020, which is a Continuation of U.S. patent application Ser. No. 16/573,018, filed Sep. 17, 2019, now issued as U.S. Pat. No. 10,720,604, which claims priority from and the benefit of Korean Patent Application No. 10-2018-0129286, filed on Oct. 26, 2018, each of which is hereby incorporated by reference for all purposes as if fully set forth herein.

BACKGROUND

Field

Exemplary embodiments relate to a display apparatus and a method of manufacturing the same, and more particularly, to a display apparatus in which a dead space is reduced and a high-quality image may be implemented and a method of manufacturing the display apparatus.

Discussion of the Background

A display apparatus is an apparatus which visually displays data. Recently, various additional utilizations of the display apparatus have come into use. In addition, as a thickness of the display apparatus has become smaller and a weight thereof has become lighter, the display apparatus is increasingly being widely used.

The display apparatus includes a substrate partitioned into a display area and a peripheral area that is a non-display area outside the display area. The peripheral area, including non-display elements such as a pad, a plurality of wires, a driving circuit, etc., is a dead space that may not display an image. Recently, there is an increasing demand to reduce the dead space of the display apparatus.

The display apparatus includes a plurality of various layers over a substrate. When an external force is applied to the plurality of various layers or depending on a process condition in a process of manufacturing the display apparatus, such a plurality of various layers may be damaged or become a path via which cracks spread. The spread of the cracks affects durability and image quality of the display apparatus.

The above information disclosed in this Background section is only for understanding of the background of the inventive concepts, and, therefore, it may contain information that does not constitute prior art.

SUMMARY

Exemplary embodiments of the present invention provide a display apparatus in which a dead space is reduced and a high-quality image is provided, and a method of manufacturing the same.

Additional features of the inventive concepts will be set forth in the description which follows, and in part will be apparent from the description, or may be learned by practice of the inventive concepts.

An exemplary embodiment of the present invention provides a display apparatus including a substrate; a display area arranged on the substrate and including a plurality of pixels, and a peripheral area outside the display area; a dam surrounding the display area; a crack detector arranged between the dam and an end of the substrate and electrically connected to at least one of the plurality of pixels; a crack prevention dam between the dam and the end of the substrate; and an encapsulation layer including a first inorganic layer, an organic layer, and a second inorganic layer, each covering the display area and a portion of the peripheral area. The first inorganic layer and the second inorganic layer in the encapsulation layer extend to the end of the substrate.

The crack prevention dam may be arranged between the crack detector and the end of the substrate.

The crack prevention dam may be arranged to overlap the crack detector.

The crack detector may be arranged between the crack prevention dam and the end of the substrate.

The display apparatus may further include a first insulating layer in the display area and the peripheral area, wherein the crack detector is arranged over a first insulating layer in the peripheral area.

The crack prevention dam may include at least one slit in the first insulating layer, and a cladding covering the at least one slit.

The display apparatus may further include a first barrier layer between the substrate and the first insulating layer.

The first barrier layer may extend to the end of the substrate.

The first inorganic layer in the encapsulation layer may be in direct contact with the first barrier layer between the crack detector and the end of the substrate.

The first inorganic layer in the encapsulation layer may be in direct contact with the first barrier layer between the crack prevention dam and the end of the substrate.

The display apparatus may further include a first insulating layer in the display area and the peripheral area, wherein at least one slit is arranged in the first insulating layer in the peripheral area, and the crack detector is arranged in the at least one slit in the first insulating layer.

The substrate may include a flexible material.

The substrate may further include a first layer including an organic material, a second layer including an organic material, and a second barrier layer between the first layer and the second layer.

The display apparatus may further include a thin-film transistor arranged on the substrate and including an active layer, a gate electrode, a source electrode, and a drain electrode; a first electrode connected one of the source electrode and the drain electrode; a pixel-defining layer configured to define the first electrode; a second electrode facing the first electrode; and an intermediate layer arranged between the first electrode and the second electrode and including an organic light-emitting layer. The display apparatus further includes a first insulating layer in the display area and the peripheral area, and the first insulating layer includes at least one of insulating layers arranged between the active layer, the gate electrode, the source electrode, and the drain electrode in the thin-film transistor.

The display apparatus may further include a passivation layer on the source electrode and the drain electrode, wherein the cladding layer includes a same material as a material of the passivation layer.

The dam may include a same material as a material of at least one of the passivation layer and the pixel-defining layer.

The dam may include a first dam near the display area, and a second dam between the first dam and the crack detector.

The display apparatus may further include a spacer on the pixel-defining layer, wherein an uppermost portion of the second dam includes a same material as a material of the spacer.

Another exemplary embodiment of the present invention provides a method of manufacturing a display apparatus by performing a cutting process with reference to a cutting line on a mother substrate to thereby split the mother substrate into a plurality of display apparatuses, wherein the plurality of display apparatuses include a display area including a plurality of pixels and a peripheral area outside the display area. The method includes forming a first insulating layer on the mother substrate; forming a dam on the first insulating layer to surround the display area, a crack detector electrically connected to at least one of the plurality of pixels, and a crack prevention dam between the dam and the cutting line, each in the peripheral area of each of the plurality of display apparatuses; and forming an encapsulation layer including a first inorganic layer, an organic layer, and a second inorganic layer in the display area and the peripheral area, wherein the first inorganic layer and the second inorganic layer are formed on the cutting line of the mother substrate to extend over a peripheral areas of a display apparatus adjacent to the first inorganic layer and the second inorganic layer, and then, cut with reference to the cutting line in a process of cutting the mother substrate.

The organic layer in the encapsulation layer may be formed by using a first open mask including a plurality of first openings corresponding to the display area and a portion of the peripheral area of each of the display apparatuses, and the first inorganic layer and the second inorganic layer in the encapsulation layer are formed by using a second open mask including a second opening corresponding to the mother substrate to thereby connect a peripheral area of each of the plurality of display apparatuses to each other.

The crack detector and the crack prevention dam may include the same material as a material of an insulating layer in the display area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
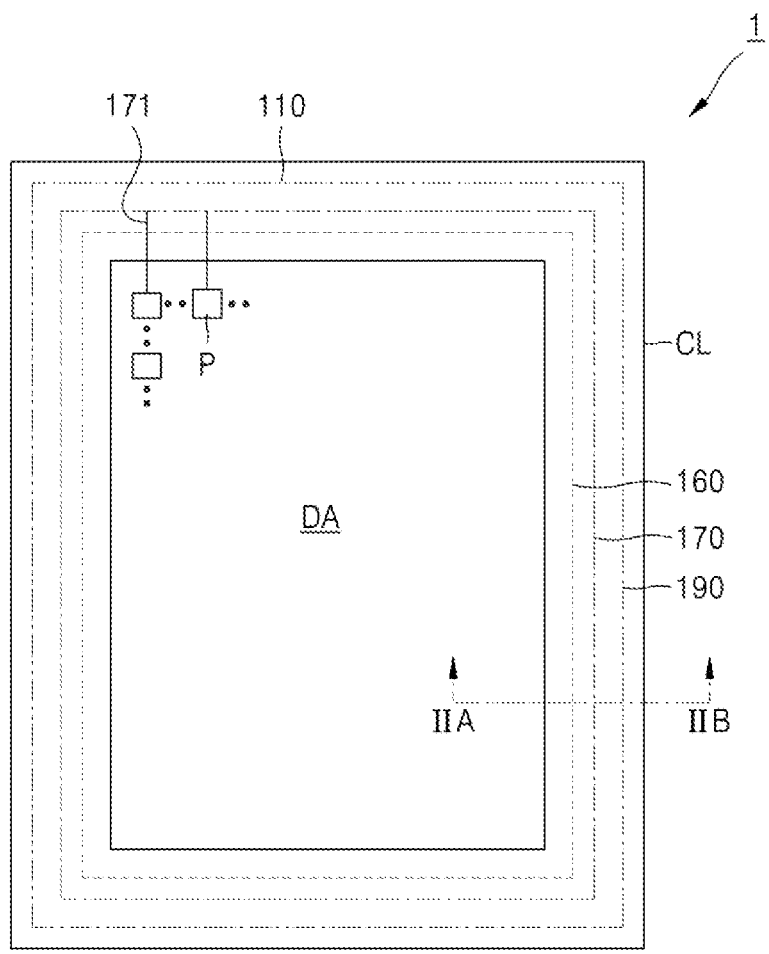
FIG. 1 is a schematic plan view of a display apparatus according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

A display apparatus is a device that displays an image. The display apparatus may be a liquid crystal display apparatus, an electrophoretic display apparatus, an organic light-emitting display apparatus, an inorganic electroluminescent (EL) display (an inorganic light-emitting display) apparatus, a field emission display apparatus, a surface-conduction electron-emitter display apparatus, a plasma display apparatus, a cathode ray tube display apparatus, etc.

Hereinafter, an organic light-emitting display apparatus is described as an example of the display apparatus according to an exemplary embodiment. However, the display apparatus of the inventive concept is not limited thereto, and various types of display apparatuses may be used.

Figure 2:
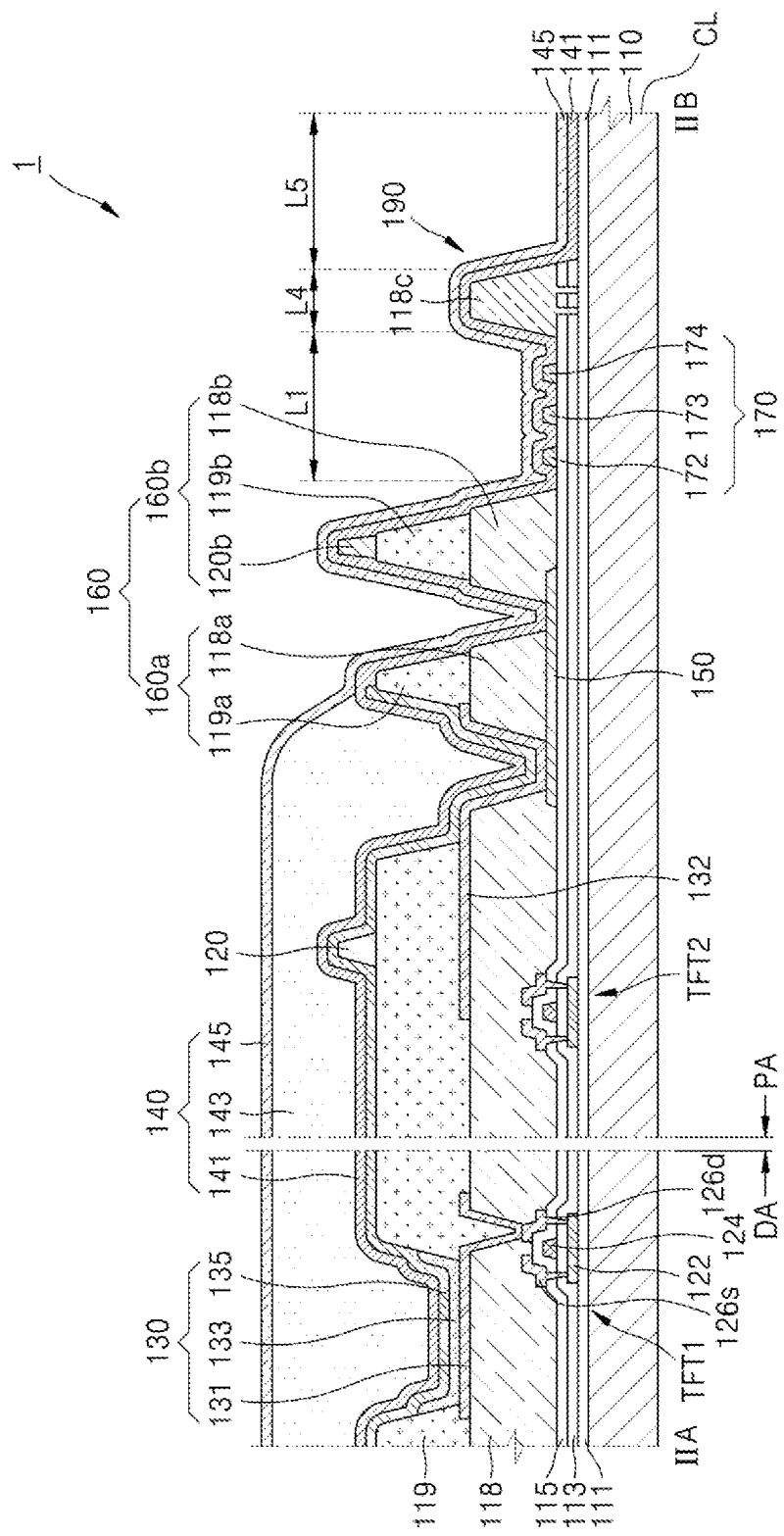
FIG. 2 is a schematic cross-sectional view of a portion of an organic light-emitting display apparatus taken along a line IIA-IIB of FIG. 1.

FIG. 1 is a schematic plan view of a display apparatus 1 according to an exemplary embodiment. FIG. 2 is a schematic cross-sectional view of the display apparatus 1 that is an organic light-emitting display apparatus taken along a line IIA-IIB of FIG. 1.

Referring to FIGS. 1 and 2, according to an exemplary embodiment, the display apparatus 1 includes a display area DA and a peripheral area PA that is a non-display area outside the display area DA, both on a substrate 110. The display area DA includes a plurality of pixels P, and the peripheral area PA outside the display area DA includes a dam 160 surrounding the display area DA. Outside the dam 160, a crack detector 170 and a crack prevention dam 190 are arranged adjacent to each other. A portion of an encapsulation layer 140 covering the display area DA extends to an end CL of the substrate 110.

The substrate 110 may be formed of various materials such as glass, metal, plastic, or the like. For example, the substrate 110 may include a flexible substrate including a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), cellulose acetate propionate (CAP), or the like.

The display area DA is an area for displaying an image. In the display area DA, a plurality of first thin-film transistors TFT1 and a plurality of organic light-emitting diodes electrically connected thereto may be arranged.

Between the plurality of first thin-film transistors TFT1 and the substrate 110, a first barrier layer 111 may be arranged. The first barrier layer 111 includes silicon oxide, silicon nitride, and/or silicon oxynitride. The first barrier layer 111 may enhance smoothness of an upper surface of the substrate 110 or prevent or reduce intrusion of impurities into a semiconductor layer 122 via the substrate 110.

The semiconductor layer 122 may include amorphous silicon or polycrystalline silicon. Alternatively, the semiconductor layer 122 may include oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layer 122 may include a channel area (not shown), and a source area (not shown) and a drain area (not shown), in which both the source area and the drain area have a higher carrier concentration than that of the channel area.

A gate electrode 124 is arranged above the semiconductor layer 122. According to a signal applied to the gate electrode 124, a source electrode 126s electrically communicates with a drain electrode 126d. Considering adherence of the gate electrode 124 to an adjacent layer, surface smoothness of a layer on which the gate electrode 124 is arranged, and processing properties of the gate electrode 124, the gate electrode 124 may be formed to have a single-layered or multi-layered structure including one or more materials among aluminum (Al), platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), Ti, tungsten (W), and copper (Cu).

To ensure insulating properties between the semiconductor layer 122 and the gate electrode 124, a gate insulating layer 113 may be arranged between the semiconductor layer 122 and the gate electrode 124, wherein the gate insulating layer 113 includes silicon oxide, silicon nitride and/or silicon oxynitride.

An interlayer insulating layer 115 is arranged on the gate electrode 124, wherein the interlayer insulating layer 115 includes silicon oxide, silicon nitride and/or silicon oxynitride. The source electrode 126s and the drain electrode 126d may be arranged on the interlayer insulating layer 115. The source electrode 126s and the drain electrode 126d are each electrically connected to the semiconductor layer 122 via contact holes in the interlayer insulating layer 115 and the gate insulating layer 113.

The source electrode 126s and the drain electrode 126d may be formed to have a single-layered or multi-layered structure including one or more materials among Al, Pt, Pd, Ag, Mg, Au, Ni, Nd, Ir, Cr, Li, Ca, Mo, Ti, W, and Cu, considering adherence to an adjacent layer, surface smoothness and processing properties of a stacked layer.

In the peripheral area PA of the substrate 110, a second thin-film transistor TFT2 may be arranged. The second thin-film transistor TFT2 may be a portion of a circuit configured to control an electrical signal applied to the inside of the display area DA.

The second thin-film transistor TFT2 may be formed to have the same structure as that of the plurality of first thin-film transistors TFT1 described above. Alternatively, the second thin-film transistor TFT2 may be formed to have a structure different from that of the plurality of first thin-film transistors TFT1.

The second thin-film transistor TFT2 may be formed to have a same material as that of the plurality of first thin-film transistors TFT1. For example, the second thin-film transistor TFT2 may include a semiconductor layer (not shown) including amorphous silicon, polycrystalline silicon, or an organic semiconductor material. Alternatively, the second thin-film transistor TFT2 may be formed of a material different from that of the plurality of first thin-film transistors TFT1.

A first barrier layer 111, the gate insulating layer 113, and the interlayer insulating layer 115 are formed in both the display area DA and the peripheral area PA.

Over the plurality of first thin-film transistors TFT1 and the second thin-film transistor TFT2, a passivation layer 118 may be arranged. The passivation layer 118 resolves a height difference between the plurality of first thin-film transistors TFT1 and the second thin-film transistor TFT2 and planarizes an upper surface of the display apparatus 1 to thereby prevent occurrence of a defect in the plurality of organic light-emitting diodes 130 that may be caused by unevenness below the plurality of organic light-emitting diodes 130.

The passivation layer 118 may be formed to have a single-layered or multi-layered structure including an organic material. The organic materials may include a general-purpose polymer, such as polymethyl methacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof. Alternatively, the passivation layer 118 may be formed of a composite stack including an inorganic insulating layer and an organic insulating layer.

The passivation layer 118 is formed in both the display area DA and the peripheral area PA.

In the display area DA, the plurality of organic light-emitting diodes 130 are arranged. The plurality of organic light-emitting diodes 130 include a first electrode 131, a second electrode 135, and an intermediate layer 133 arranged therebetween and having an organic emissive layer (not shown).

The first electrode 131 may include a transparent electrode or a reflective electrode. When the first electrode 131 includes a transparent electrode, the first electrode 131 may include a transparent conductive layer.

The transparent conductive layer may be at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In this case, the first electrode 131 may further include a semi-transmissible layer configured to enhance light efficiency, in addition to the transparent conductive layer. The semi-transmissible layer may be at least one selected from the group consisting of Ag, Mg, Al, Pt, Pd, Au, Ni, Nd, Ir, Cr, Li, Ca, and ytterbium (Yb) in a form of a thin film with a thickness of about several to tens of nm.

When the first electrode 131 includes a reflective electrode, the first electrode 131 may include a reflective layer formed of Ag, Mg, Al, Pt, Pd, Au, Ni, Nd, Ir, Cr, or a compound thereof, and a transparent conductive layer above and/or below the reflective layer. The transparent conductive layer may be formed of at least one selected from the group consisting of ITO, IZO, ZnO, $In_2O_3$, IGO, and AZO.

However, the inventive concepts are not limited thereto. The first electrode 131 may be formed of various materials. A structure of the first electrode 131 may be variously modified, for example, to have a single layer or multiple layers.

On the passivation layer 118, a pixel-defining layer 119 may be arranged over the display area DA and the peripheral area PA.

The pixel-defining layer 119 exposes a central portion of the first electrode 131, and defines a pixel that is a light-emitting area. In addition, the pixel-defining layer 119 may prevent an arc from occurring at an edge of the first electrode 131 by covering the edge of the first electrode 131.

The pixel-defining layer 119 may be formed of an organic material such as PI, hexamethyldisiloxane (HMDSO), etc. The pixel-defining layer 119 may include a material that is the same as, or different from, that of the passivation layer 118.

In a portion of the display area DA or the peripheral area PA, a spacer 120 may be further arranged on the pixel-defining layer 119. FIG. 2 illustrates that the spacer 120 is arranged on the pixel-defining layer 119 in the peripheral area PA. However, this is only an example. The spacer 120 may be arranged on the pixel-defining layer 119 in the display area DA.

The spacer 120 protrudes in a direction from the pixel-defining layer 119 toward the encapsulation layer 140. The spacer 120 may prevent a defect that may be caused by imprinting of a mask, etc. in a process. The spacer 120 may be formed of an organic material such as PI, HMDSO, etc.

The intermediate layer 133 in the organic light-emitting diode 130 may include a low-molecular weight or polymer material.

When the intermediate layer 133 includes a low-molecular weight material, the intermediate layer 133 may have a single-layered or multiple-layered structure in which a hole injection layer (HIL), a hole transport layer (HTL), an emission layer (EML), an electron transport layer (ETL), an electron injection layer (EIL), etc. are stacked. The intermediate layer 133 may include various organic materials, such as copper phthalocyanine (CuPc), N,N'-di(naphthalene-1-yl)-N,N'-diphenyl-benzidine (NPB), tris-8-hydroxyquinoline aluminum (Alq3), etc. The intermediate layer 133 may be formed by using various methods such as a vacuum deposition method, etc.

When the intermediate layer 133 includes a polymer material, the intermediate layer 133 may generally have a structure including an HTL or an EML. In this case, the HTL may include a PEDOT, and the EML may include a polymer material, such as poly(phenylenevinylene) (PPV), polyfluorene, or the like. The intermediate layer 133 may be formed by using various methods, such as a screen printing method, an inkjet printing method, a laser induced thermal imaging (LITI) method, or the like.

The intermediate layer 133 may include a layer arranged as one body over a plurality of first electrodes 131. Alternatively, the intermediate layer 133 may include a layer patterned to each of the plurality of first electrodes 131.

The second electrode 135 is formed over the display area DA and the peripheral area PA. The second electrode 135 may be formed as one body with respect to the plurality of organic light-emitting diodes 130 to correspond to the plurality of first electrodes 131 as a common electrode.

The second electrode 135 is connected to a power supply line 150 in the peripheral area PA.

The power supply line 150 may be formed of a same material as that of the source electrode 126s and the drain electrode 126d. On the power supply line 150, the passivation layer 118 having a first opening and the pixel-defining layer 119 having a second opening are arranged. The passivation layer 118 and the pixel-defining layer 119 each may be electrically connected to the second electrode 135 via the first and second openings to thereby apply low-voltage power to the plurality of organic light-emitting diodes 130. Between the second electrode 135 and the power supply line 150, a connection conductive layer 132 may be formed of a same material as that of the first electrode 131.

The second electrode 135 may include a transparent electrode or a reflective electrode.

When the second electrode 135 includes a transparent electrode, the second electrode 135 may include one or more materials selected from Ag, Al, Mg, Li, Ca, Cu, lithium-fluoride-calcium (LiF/Ca), lithium-fluoride-aluminum (LiF/Al), MgAg, and CaAg. The second electrode 135 may be formed as a thin film with a thickness of about several to tens of nm.

When the second electrode 135 includes a reflective electrode, the second electrode 135 may be formed of at least one selected from the group consisting of Ag, Al, Mg, Li, Ca, Cu, LiF/Ca, LiF/Al, MgAg, and CaAg. A structure or a material of the second electrode 135 is not limited thereto, and may be variously modified.

In the peripheral area PA, a dam 160 is formed to cover at least a portion of the power supply line 150 and surround the display area DA.

When an organic layer 143 in the encapsulation layer 140 is formed such that the encapsulation layer 140 seals the display area DA and the peripheral area PA, the dam 160 may prevent forming of an edge tail of the organic layer 143 by obstructing an organic material from flowing in a direction toward an edge of the substrate 110.

A first dam 160a may be arranged on the power supply line 150.

The first dam 160a may have a structure in which a first layer 118a arranged as the passivation layer 118, and a second layer 119a arranged as the pixel-defining layer 119, are stacked.

By forming the first layer 118a of an organic material with a more excellent adhesive force to metal than that of an inorganic material wherein the first layer 118a is in direct contact with an upper surface of the power supply line 150, the first dam 160a may be stably arranged on the power supply line 150. However, the inventive concepts are not limited thereto. The first dam 160a may be formed to include another material or to have a height different from a height of the first layer 118a added to a height of the second layer 119a.

Outside the first dam 160a, a second dam 160b may be arranged to cover an end of the power supply line 150.

The second dam 160b may have a structure in which a first layer 118b, the second layer 119b, and a third layer 120b are stacked. The first layer 118b is formed as the passivation layer 118, the second layer 119b is formed as the pixel-defining layer 119, and the third layer 120b is formed as the spacer 120. The second dam 160b may be higher than the first dam 160a.

The first layer 118b in the second dam 160b may cover the end of the power supply line 150 to thereby prevent the power supply line 150 from deteriorating in a process of manufacturing a backplane by using heat or a chemical.

The second dam 160b may prevent a leak of the organic layer 143 to the peripheral area PA and be formed to be higher than the first dam 160a. Accordingly, while a metal mask (not shown) is used in a process of forming the encapsulation layer 140, a phenomenon in which the metal mask is imprinted on a surface of the second electrode 135 may be prevented.

FIG. 2 illustrates two dams, that is, the first dam 160a and the second dam 160b. However, the inventive concepts are not limited thereto. The number, a height, a material, etc. of dams may be variously modified.

The crack detector 170 configured to detect a crack is arranged outside and adjacent to the dam 160.

The display apparatus 1 includes a plurality of layers over the substrate 110. For example, inorganic layers, such as the gate insulating layer 113 and the interlayer insulating layer 115, are arranged over the substrate 110.

When an external force is applied to the display apparatus 1, the inorganic layers such as the gate insulating layer 113 and the interlayer insulating layer 115 may become a path via which cracks spread. For example, in a scribing process of separating a mother substrate MSU (refer to FIG. 9) into a plurality of display apparatuses, when cracks occur while the mother substrate MSU is cut along a cutting line CL (refer to FIG. 9) that is the end CL of the substrate 110, the cracks may spread to the display area DA along a side of the inorganic layers.

The crack detector 170 includes at least one of first to third crack detection wires 172, 173, and 174 on the interlayer insulating layer 115. The crack detector 170 may be electrically connected to a pixel P in the display area DA via a connection line 171 (refer to FIG. 1).

As an example, the crack detector 170 may be connected a gate line (not shown) or a data line (not shown) connected to a pixel P. As an example, when cracks occur, and thus, at least one of the first to third crack detection wires 172, 173, and 174 is damaged, a resistance in the gate line or the data line connected to the at least one of first to third crack detection wires 172, 173, and 174 increases. Since an abnormal signal in which a voltage difference has occurred compared to that of a normal signal is input to a pixel P connected to the at least one of first to third crack detection wires 172 to 174, light with a color different from a reference color is emitted. Thus, occurrence of the cracks on the substrate 110 may be checked.

As such, by using the crack detector 170, a crack that has occurred in the display apparatus 1 may be detected in advance to thereby prevent a release of a defective product.

The crack prevention dam 190 is arranged outside and adjacent to the crack detector 170.

As described above, since a crack that has occurred in the display apparatus may cause a defect in a pixel, spread of the crack in the substrate 110 to the display area DA needs to be reduced to enhance a yield rate.

The crack prevention dam 190 includes at least one slit SL in the gate insulating layer 113 and the interlayer insulating layer 115, and a cladding 118c covering the at least one slit SL. The at least one slit SL may be formed in a direction crossing an upper surface of the substrate 110. As an example, the cladding 118c may be formed as a portion of the passivation layer 118. However, this is only an example.

Figure 4A:
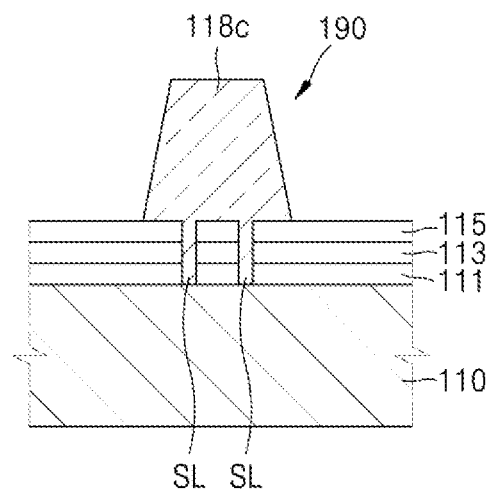
FIGS. 4A, 4B, and 4C are cross-sectional views illustrating various exemplary embodiments of a crack prevention dam.
Figure 4B:
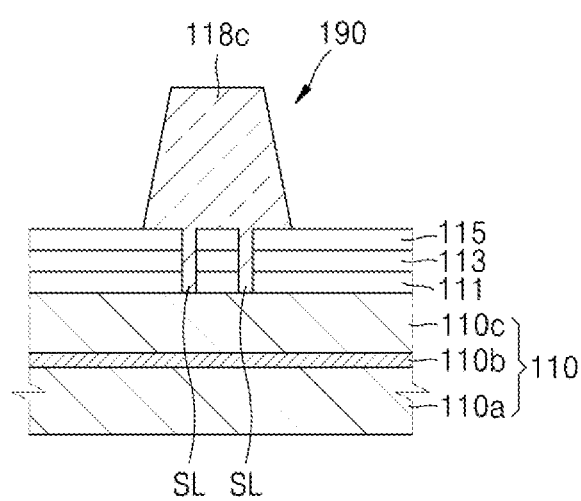
Figure 4C:
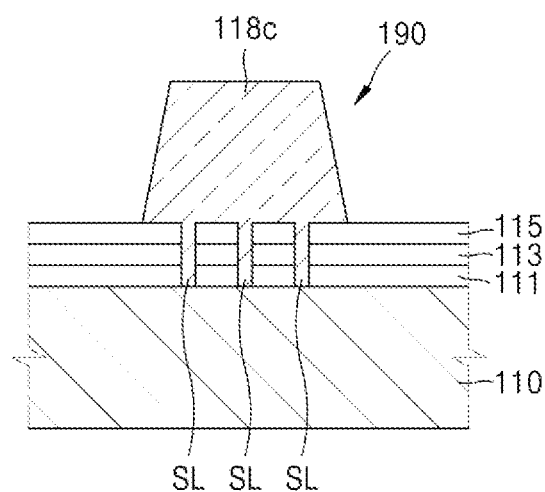

FIGS. 4A to 4C illustrate various structures of the substrate 110, inorganic layers, and the crack prevention dam 190.

Referring to FIG. 4A, throughout the first barrier layer 111, the gate insulating layer 113, and the interlayer insulating layer 115 over the substrate 110, two slits SL are formed in a direction toward the substrate 110 and the cladding 118c is formed to cover the two slits SL.

Referring to FIG. 4B in comparison with FIG. 4A, the substrate 110 has a multiple-layered structure. The substrate 110 may include a first layer 110a including an organic material, a second layer 110c including an organic material, and a second barrier layer 110b between the first layer 110a and the second layer 110c. By forming the substrate 110 with a multiple-layered structure, intrusion of external impurities from a lower surface of the substrate 110 to the display area DA may be prevented Referring to FIG. 4C in comparison with FIG. 4A, more slits SL are arranged. The number of slits SL may be variously modified.

In addition, a depth of the slits SL may be modified. For example, the slits SL need not extend the entire depths of the first barrier layer 111, the gate insulating layer 113, and the interlayer insulating layer 115, as shown in FIGS. 4A to 4C. For example, a part or all of the first barrier layer 111 may not be opened. In addition, a part or all of the gate insulating layer 113 may not be opened. Only some of the insulating layers described above may be arranged between the substrate 110 and the crack prevention dam 190.

By configuring the crack prevention dam 190 as described above, spread of a crack that has occurred in the substrate 110 to the display area DA may be reduced.

The encapsulation layer 140 may cover the display area DA and extend to the peripheral area PA. As shown in FIG. 2, the encapsulation layer 140 may include a first inorganic layer 141, the organic layer 143, and a second inorganic layer 145.

The first inorganic layer 141 may completely cover the first electrode 131 and include silicon oxide, silicon nitride, and/or silicon oxynitride.

As needed, other layers, such as a capping layer (not shown) configured to enhance light efficiency and protect a light-emitting diode, may be arranged between the first inorganic layer 141 and the second electrode 135.

For example, the capping layer (not shown) may include one or more organic or inorganic materials among silicon dioxide ($SiO_2$), silicon nitride (SiNx), zinc peroxide ($ZnO_2$), titanium dioxide ($TiO_2$), zirconium dioxide ($ZrO_2$), ITO, IZO, Alq3, CuPc, 4'-bis(N-carbazolyl)-1,1'-biphenyl (CBP), N,N'-di(naphthalene-1-yl)-N,N'-diphenyl-benzidine (a-NPB), and zirconium dioxide ($ZiO_2$). In another exemplary embodiment, the capping layer (not shown) may generate a plasmon resonance phenomenon with respect to light generated by the plurality of organic light-emitting diodes 130. For example, the capping layer (not shown) may include nanoparticles.

The capping layer (not shown) may prevent the organic light-emitting diode 130 from being damaged by heat, plasma, etc., generated in a chemical vapor deposition process or a sputtering process for forming the encapsulation layer 140. For example, the capping layer (not shown) may include an epoxy-based material formed of at least one of a bisphenol type epoxy resin, an epoxidized butadiene resin, a fluorine type epoxy resin, and a novolac epoxy resin.

In addition, a layer (now shown) including lithium-fluoride (LiF), etc. may be arranged between the first inorganic layer 141 and the capping layer (not shown) as needed.

Since the first inorganic layer 141 is arranged along a structure therebelow, an upper surface of the first inorganic layer 141 may be uneven, as shown in FIG. 2. The organic layer 143 may cover the uneven upper surface of first inorganic layer 141, and an upper surface of the organic layer 143 may be substantially even.

The organic layer 143 may include one or more materials selected from the group consisting of PET, PEN, PC, PI, polyethylene sulfonate, polyoxymethylene, polyarylate, PAR, and HMDSO.

The second inorganic layer 145 covers the organic layer 143 and may include silicon oxide, silicon nitride, and/or silicon oxynitride. The second inorganic layer 145 is deposited to directly contact the first inorganic layer 141 in an edge area of the display apparatus 1 so that the organic layer 143 is not exposed to outside of the display apparatus 1.

As such, since the encapsulation layer 140 includes the first inorganic layer 141, the organic layer 143, and the second inorganic layer 145, even when cracks occur in the encapsulation layer 140 due to a multiple-layered structure of the encapsulation layer 140, the cracks may not be connected to each other between the first inorganic layer 141 and the organic layer 143 or between the organic layer 143 and the second inorganic layer 145. Thus, formation of a path via which external moisture, oxygen, or the like penetrates into the display area DA may be prevented or reduced.

In the current exemplary embodiment, the first inorganic layer 141 and the second inorganic layer 145 in the encapsulation layer 140 are deposited not on a portion of the display apparatus 1, but up to the end CL of the substrate 110. With respect to a process, the first and second inorganic layers 141 and 145 in the encapsulation layer 140 are arranged up to an area of the end CL of the substrate 110 not by blocking a portion of the end CL of the substrate 110 but by constantly extending up to an area of the end CL of the substrate 110, as well as the display area DA.

Figure 3:
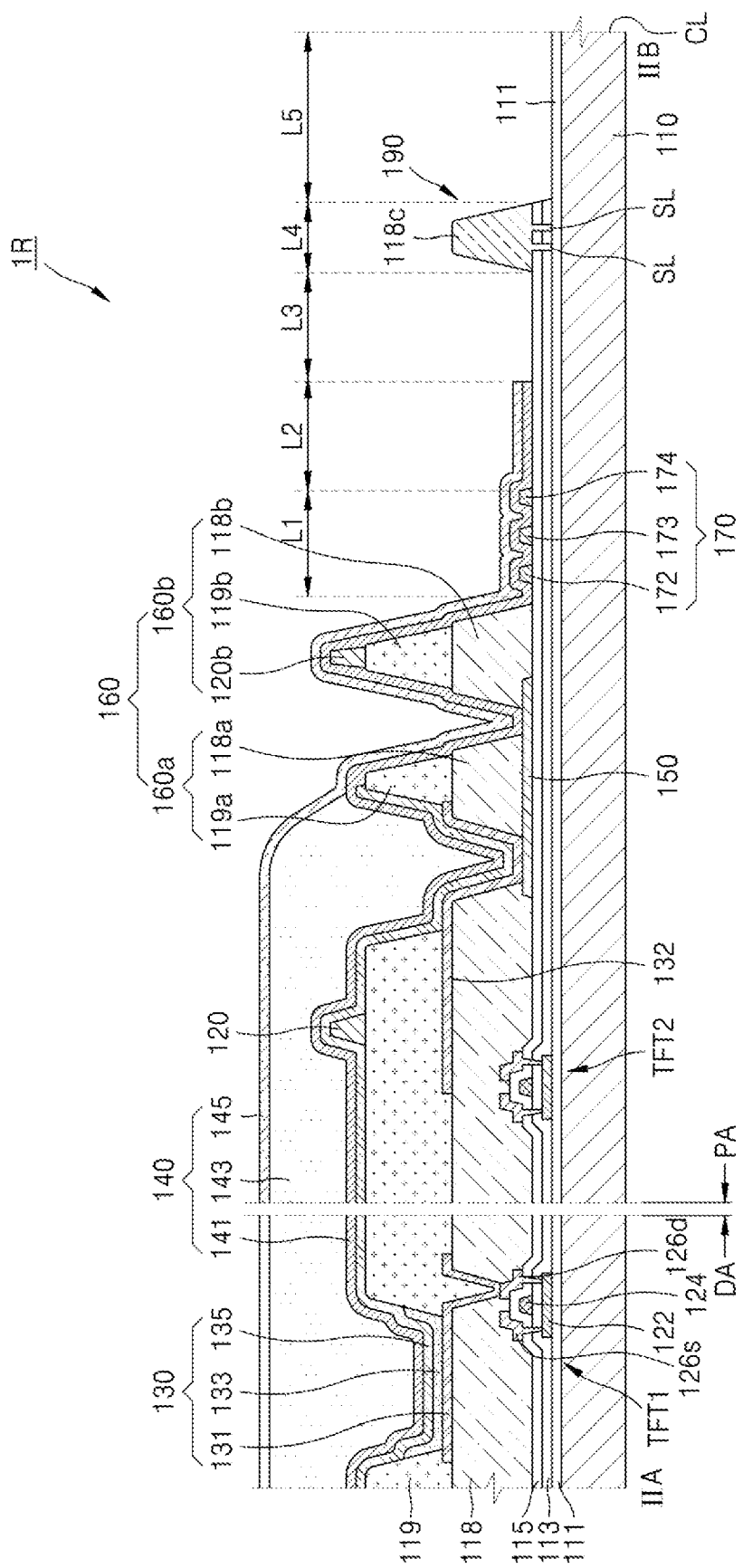
FIG. 3 is a schematic cross-sectional view of an organic light-emitting display apparatus according to a comparative example.

In a display apparatus 1R in a comparative example of FIG. 3, an area L1 in which the crack detector 170 is arranged, an inorganic layer-arranged area L2 covering the crack detector 170, a shadow area L3, the crack prevention dam 190, an area L4 in which the crack prevention dam 190 is arranged, and an area L5 in which an inorganic layer is removed from the end CL of the substrate 110 constitute a portion of a dead space.

Compared to the display apparatus 1R according to the comparative example, in the display apparatus 1 in the current exemplary embodiment of FIG. 2, the inorganic layer-arranged area L2 (refer to FIG. 3) and the shadow area L3 (refer to FIG. 3) are not arranged between the crack detector 170 and the crack prevention dam 190, and the first and second inorganic layers 141 and 145 in the encapsulation layer 140 extend up to the end CL of the substrate 110. As a result, in the display apparatus 1 in the current exemplary embodiment of FIG. 2, an entire width of a dead space is small compared to that of the display apparatus 1R in the comparative example of FIG. 3.

Figure 5:
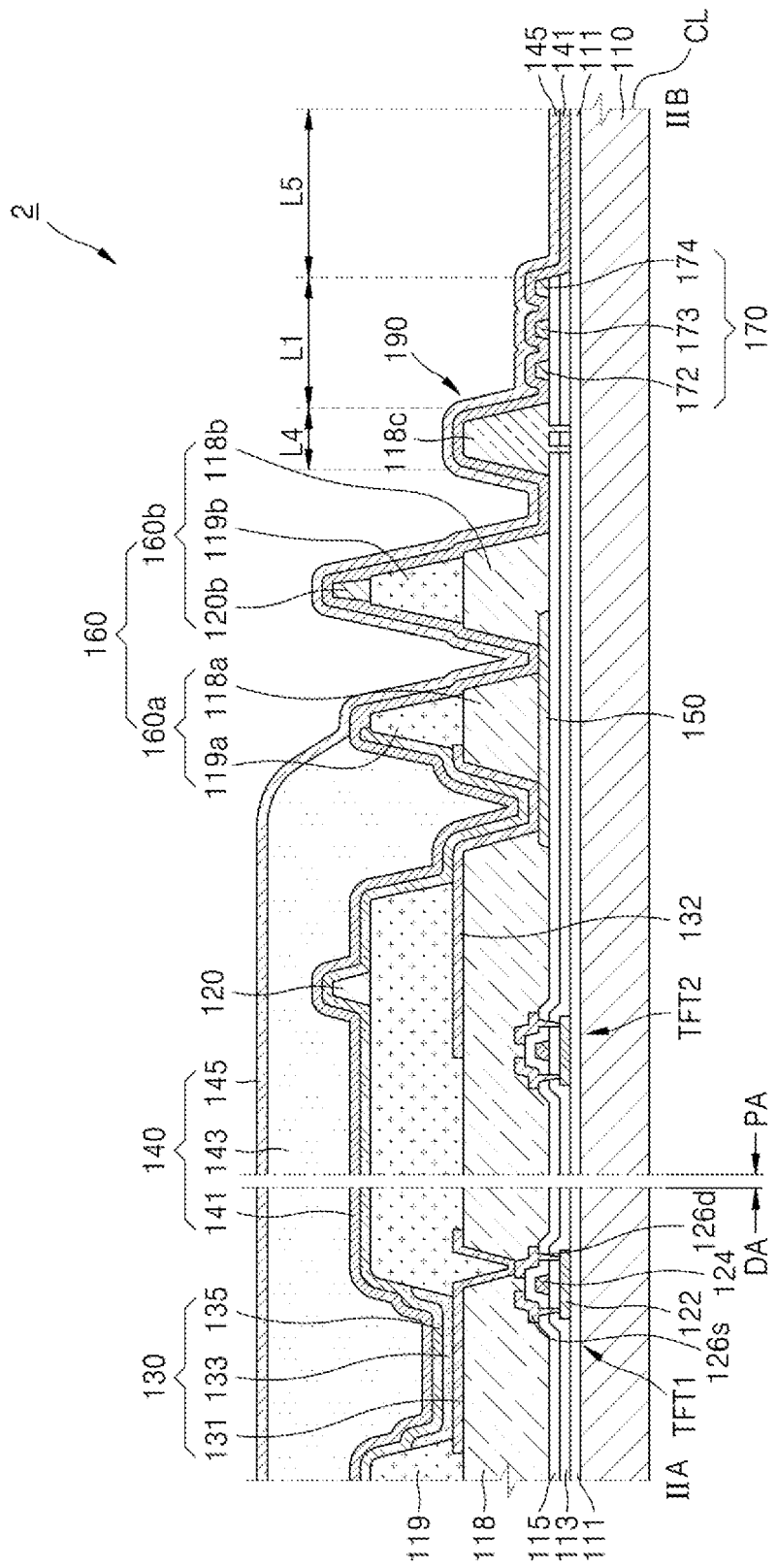
FIG. 5 is a schematic cross-sectional view of a display apparatus according to an exemplary embodiment.

Referring to FIG. 5, according to an exemplary embodiment, a display apparatus 2 includes the display area DA and the peripheral area PA that is a non-display area outside the display area DA, both on the substrate 110. The display area DA includes a plurality of pixels P, and the peripheral area PA outside the display area DA includes the dam 160 surrounding the display area DA. The crack prevention dam 190 and the crack detector 170 are arranged outside and adjacent to the dam 160. A portion of the encapsulation layer 140 covering the display area DA extends to the end CL of the substrate 110.

Compared to the display apparatus 1R according to the comparative example of FIG. 3, in the display apparatus 2 in the current exemplary embodiment, the inorganic layer-arranged area L2 (refer to FIG. 3) and the shadow area L3 (refer to FIG. 3) are not arranged between the crack detector 170 and the crack prevention dam 190, and the first and second inorganic layers 141 and 145 in the encapsulation layer 140 extend to the end CL of the substrate 110. As a result, in the display apparatus 2 in the current exemplary embodiment, an entire width of a dead space is small compared to that of the display apparatus 1R in the comparative example of FIG. 3.

Compared to the display apparatus 1 described above, the display apparatus 2 in the current exemplary embodiment is same as the display apparatus 1 in that the crack prevention dam 190 is arranged adjacent to the crack detector 170 and the first and second inorganic layers 141 and 145 in the encapsulation layer 140 extend to the end CL of the substrate 110. However, the display apparatus 2 in the current exemplary embodiment of FIG. 5 is different from the display apparatus 1 in that the crack prevention dam 190 is arranged closer to the display area DA than the crack detector 170.

Figure 6:
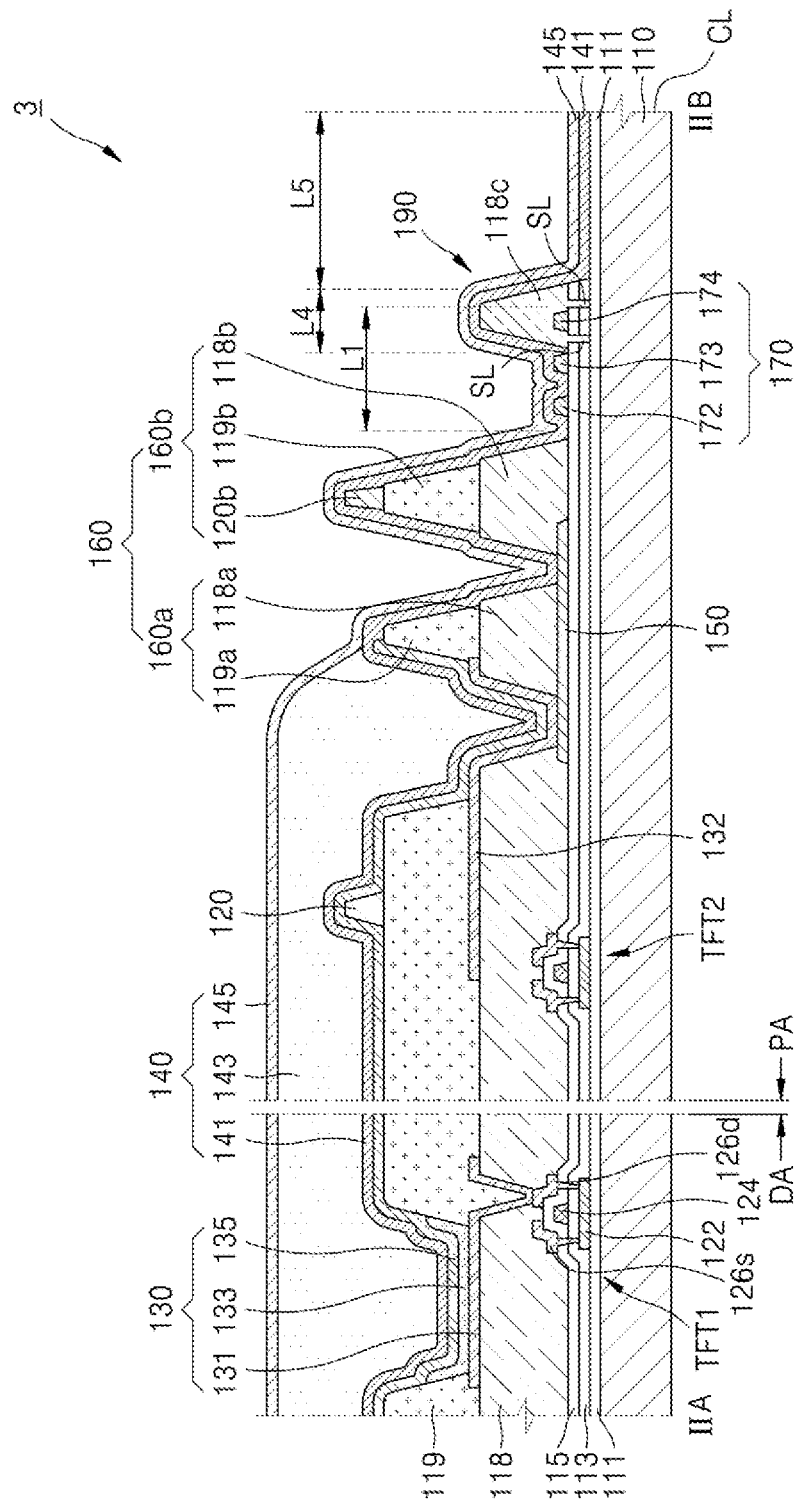
FIG. 6 is a schematic cross-sectional view of a display apparatus according to an exemplary embodiment.

Referring to FIG. 6, according to an exemplary embodiment, a display apparatus 3 includes the display area DA and the peripheral area PA that is a non-display area outside the display area DA, both on the substrate 110. The display area DA includes the plurality of pixels P, and the peripheral area PA outside the display area DA includes the dam 160 surrounding the display area DA. Outside the dam 160, the crack detector 170 is arranged to overlap the crack prevention dam 190. A portion of the encapsulation layer 140 covering the display area DA extends to the end CL of the substrate 110.

Compared to the display apparatus 1R according to the comparative example of FIG. 3, in the display apparatus 3 in the current exemplary embodiment, the inorganic layer-arranged area L2 (refer to FIG. 3) and the shadow area L3 (refer to FIG. 3) are not arranged between the crack detector 170 and the crack prevention dam 190, and the first and second inorganic layers 141 and 145 in the encapsulation layer 140 extend to the end CL of the substrate 110. As a result, in the display apparatus 2 in the current exemplary embodiment, an entire width of a dead space is small compared to that of the display apparatus 1R in the comparative example.

Compared to the exemplary embodiment described above with reference to FIG. 2, the current exemplary embodiment of FIG. 6 is the same as the exemplary embodiment described with reference to FIG. 2 in that the first and second inorganic layers 141 and 145 extend to the end CL of the substrate 110. However, the current exemplary embodiment is different from the exemplary embodiment described with reference to FIG. 2 in that the crack prevention dam 190 is arranged to overlap the crack detector 170.

Figure 7:
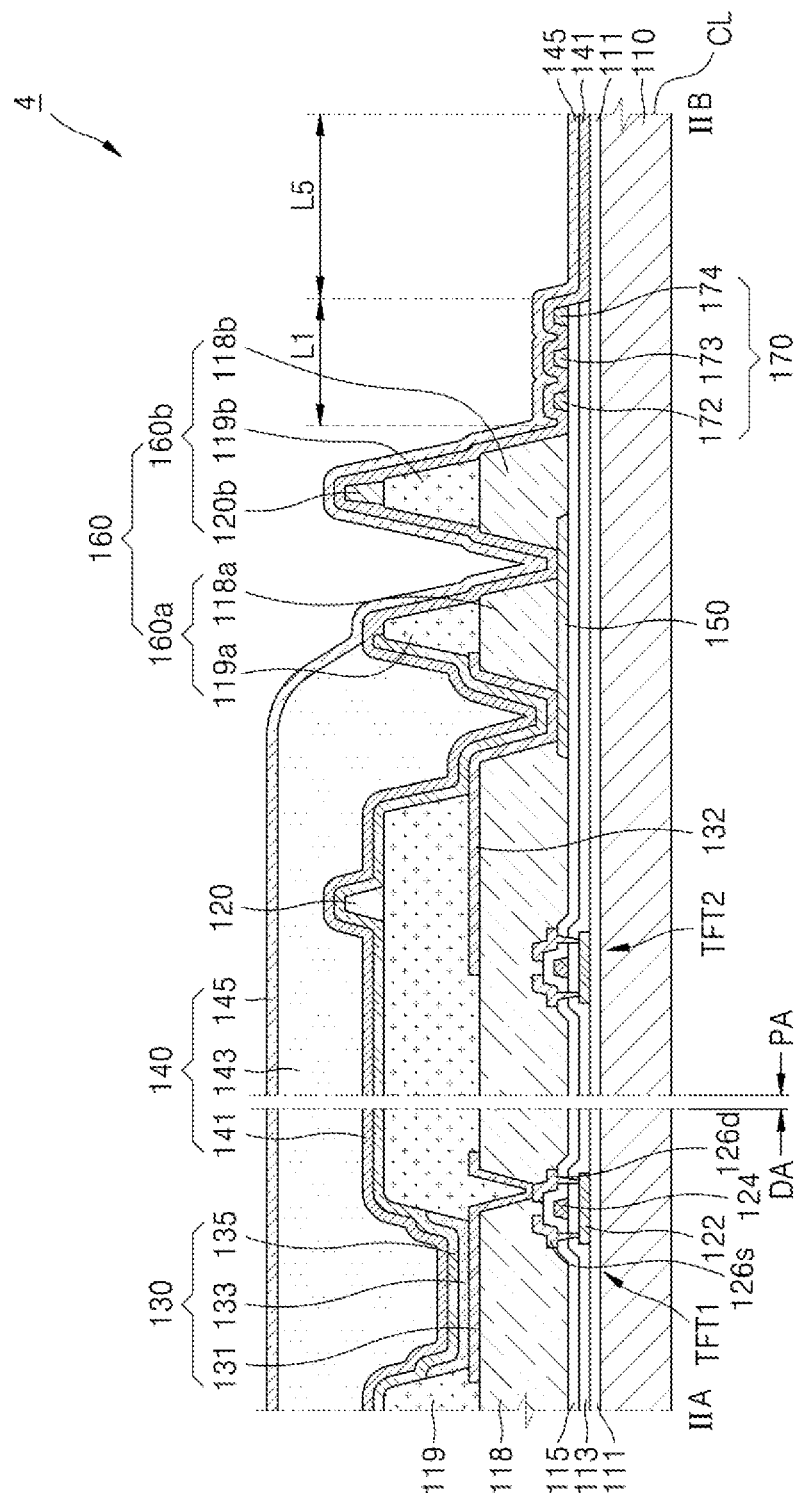
FIG. 7 is a schematic cross-sectional view of a display apparatus according to an exemplary embodiment.

Referring to FIG. 7, according to an exemplary embodiment, a display apparatus 4 includes the display area DA and the peripheral area PA that is a non-display area outside the display area DA, both on the substrate 110. The display area DA includes the plurality of pixels P, and the peripheral area PA outside the display area DA includes the dam 160 surrounding the display area DA. The crack detector 170 is arranged outside the dam 160, and a portion of the encapsulation layer 140 covering the display area DA extends to the end CL of the substrate 110.

Compared to the display apparatus 1R according to the comparative example of FIG. 3, in the display apparatus 4 in the current exemplary embodiment of FIG. 7, the area L4 in which the crack prevention dam 190 is arranged, the inorganic layer-arranged area L2 (refer to FIG. 3), and the shadow area L3 (refer to FIG. 3) are not present, and the first and second inorganic layers 141 and 145 in the encapsulation layer 140 extend to the end CL of the substrate 110. As a result, in the display apparatus 2 in the current exemplary embodiment, an entire width of a dead space is small compared to that of the display apparatus 1R in the comparative example of FIG. 3.

Compared to the exemplary embodiment described above with reference to FIG. 2, the current exemplary embodiment is same as the exemplary embodiment described with reference to FIG. 2 in that the first and second inorganic layers 141 and 145 in the encapsulation layer 140 extend to the end CL of the substrate 110. However, the current exemplary embodiment is different from the exemplary embodiment described with reference to FIG. 2 in that the crack prevention dam 190 is not present and only the crack detector 170 is present.

Figure 8:
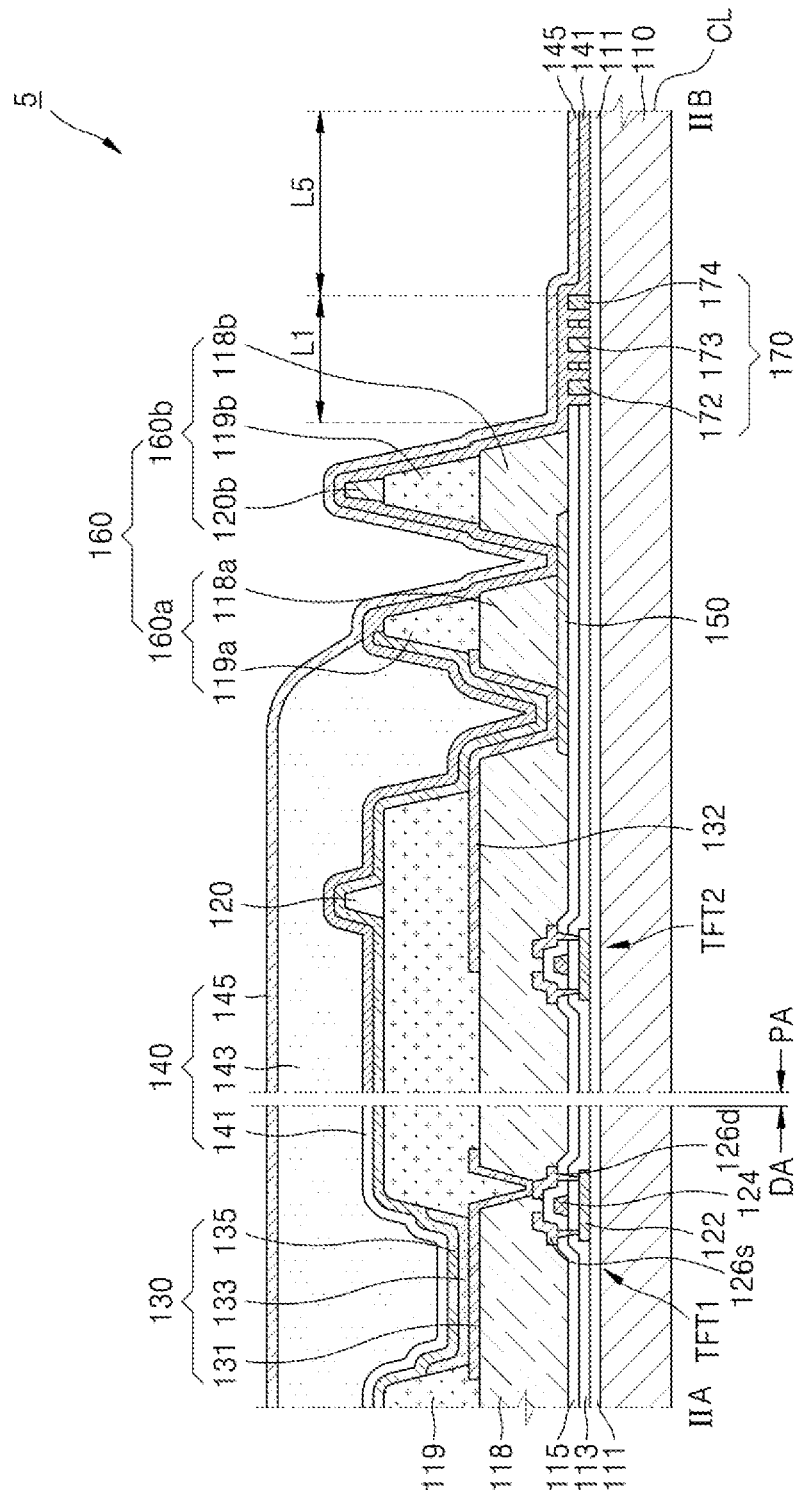
FIG. 8 is a schematic cross-sectional view of a display apparatus according to an exemplary embodiment.

Referring to FIG. 8, according to an exemplary embodiment, a display apparatus 5 includes the display area DA and the peripheral area PA that is a non-display area outside the display area DA, both on the substrate 110. The display area DA includes the plurality of pixels P, and the peripheral area PA outside the display area DA includes the dam 160 surrounding the display area DA. Outside the dam 160, the crack detector 170 is arranged, and a portion of the encapsulation layer 140 covering the display area DA extends to the end CL of the substrate 110.

Compared to the display apparatus 1R according to the comparative example of FIG. 3, in the display apparatus 5 in the current exemplary embodiment, the area L4 in which the crack prevention dam 190 is arranged, the inorganic layer-arranged area L2 (refer to FIG. 3), and the shadow area L3 (refer to FIG. 3) are not present, and the first and second inorganic layers 141 and 145 in the encapsulation layer 140 extend to the end CL of the substrate 110. As a result, in the display apparatus 5 in the current exemplary embodiment, an entire width of a dead space is small compared to that of the display apparatus 1R in the comparative example of FIG. 3.

Compared to the exemplary embodiment described above with reference to FIG. 2, the current exemplary embodiment is same as the exemplary embodiment described with reference to FIG. 2 in that the first and second inorganic layers 141 and 145 in the encapsulation layer 140 extend to the end CL of the substrate 110. However, the current exemplary embodiment is different from the exemplary embodiment described with reference to FIG. 2 in that the crack prevention dam 190 is not present and only the crack detector 170 is present.

Compared to the exemplary embodiment described above with reference to FIG. 6, the current exemplary embodiment is different from the exemplary embodiment described with reference to FIG. 6 in that the slits SL are formed in the crack detector 170 and the at least one of the first to third crack detection wires 172 to 174 is arranged between the slits SL.

Figure 9:
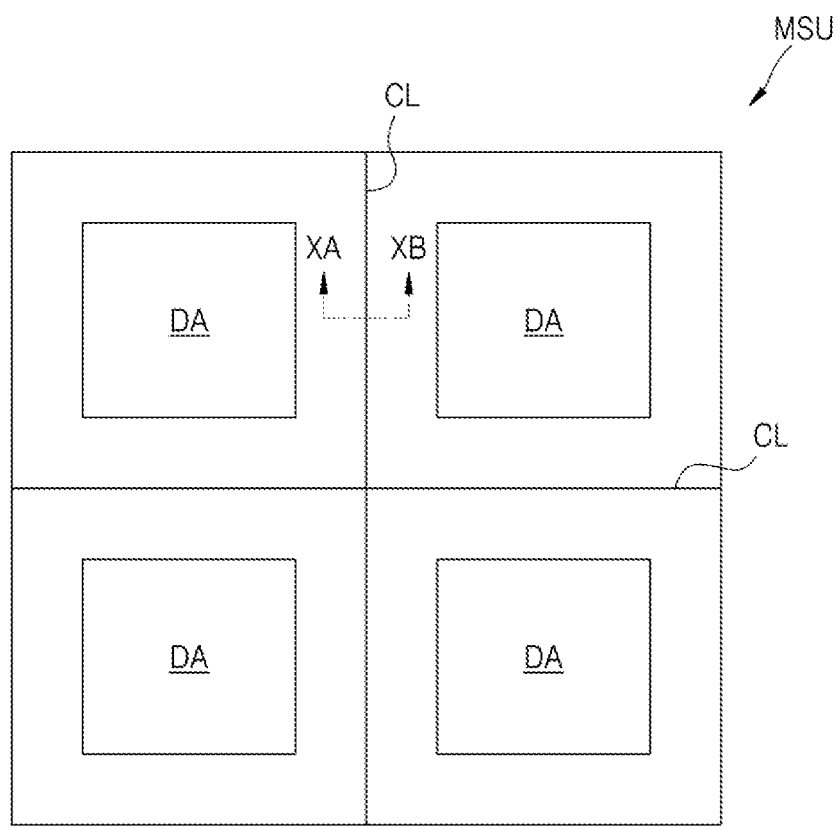
FIG. 9 is a schematic plan view of a mother substrate for manufacturing a display apparatus according to an exemplary embodiment.
Figure 10:
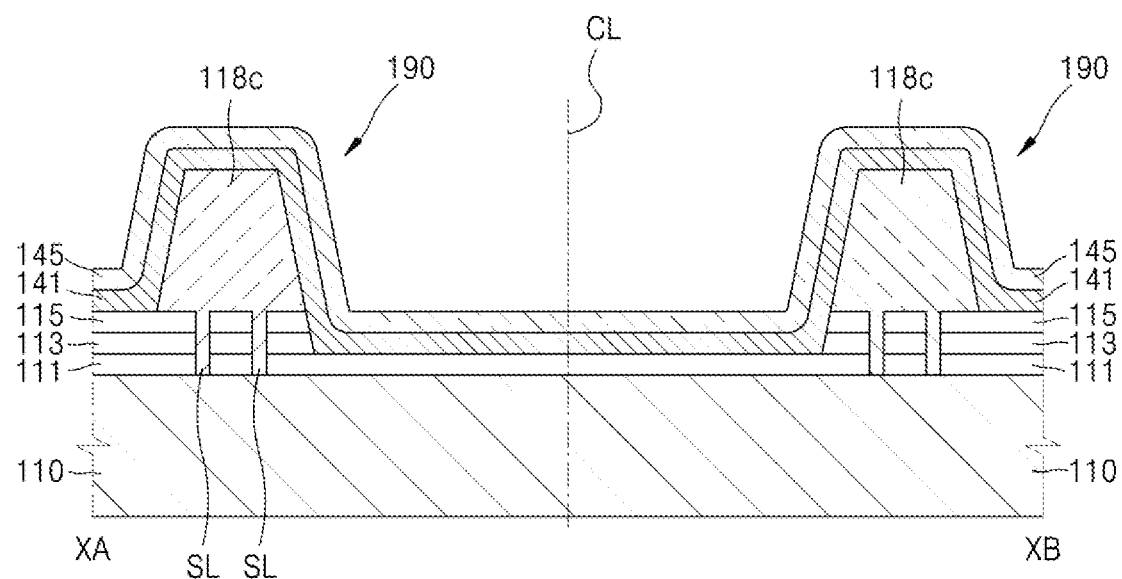
FIG. 10 is a cross-sectional view of the display apparatus taken along a line XA-XB in FIG. 9 according to an exemplary embodiment.

FIG. 9 is a plan view of a mother substrate for manufacturing a display apparatus according to an exemplary embodiment. FIG. 10 is a cross-sectional view of the display apparatus taken along a line XA-XB according to the exemplary embodiment of FIG. 9. FIG. 10 shows a peripheral area in which the crack prevention dam 190 is arranged.

Referring to FIGS. 9 and 10, according to an exemplary embodiment, a method of manufacturing the display apparatus relates to a method of manufacturing the display apparatus by performing a process of cutting the mother substrate MSU with reference to the cutting line CL (the cutting line CL becomes the end CL of the substrate 110 after the process is performed.), and then, splitting the mother substrate MSU into a plurality of display apparatuses each including the display area DA including the plurality of pixels P (refer to FIG. 1) and the peripheral area PA outside the display area DA. The method of manufacturing the display apparatus includes forming the first barrier layer 111, the gate insulating layer 113, and the interlayer insulating layer 115 that are insulating layers over the mother substrate MSU, and forming the dam 160 (refer to FIG. 1) surrounding the display area DA, the crack detector 170 (refer to FIG. 1) electrically connected to at least one of the plurality of pixels P (refer to FIG. 1), and the crack prevention dam 190 between the dam 160 and the cutting line CL, each on the first barrier layer 111, the gate insulating layer 113, and the interlayer insulating layer 115 in the peripheral area PA of the display device.

According to an exemplary embodiment, the method of manufacturing the display apparatus includes forming the encapsulation layer 140 (refer to FIG. 2) including the first inorganic layer 141, the organic layer 143 (refer to FIG. 2), and the second inorganic layer 145, each in the display areas DA and the peripheral area PA. Then, the first inorganic layer 141 and the second inorganic layer 145 are arranged on the cutting line CL of the mother substrate MSU and extend to a peripheral area PA of another display apparatus adjacent to the first inorganic layer 141 and the second inorganic layer 145, and then, cut with reference to the cutting line CL in a process of cutting the mother substrate MSU.

The organic layer 143 in the encapsulation layer 140 is formed by using a first open mask (not shown) including a plurality of first openings (not shown) corresponding to the display area DA and a portion of the peripheral areas PA of respective display apparatuses. The first inorganic layer 141 and the second inorganic layer 145 in the encapsulation layer 140 may be formed by using a second open mask (not shown) including a second opening (not shown) corresponding to the mother board MSU to connect the peripheral areas PA of respective display apparatuses to each other. A size of the second opening of the second open mask is greater than that of the plurality of first openings of the first open mask.

In addition, as described above with respect to the exemplary embodiments with reference to FIGS. 2, 5, 7, and 8, the crack detector 170 and/or the crack prevention dam 190 may be formed of the same materials as those of the insulating layers such as the first barrier layer 111, the gate insulating layer 113, and the interlayer insulating layer 115.

According to one or more exemplary embodiments, a dead space of a display apparatus may be reduced by reducing a distance between a crack detector and a crack prevention dam.

In addition, the durability of the display apparatus may be enhanced by obstructing cracks from spreading to a display area, and a defect rate may be reduced by detecting cracks that have occurred by using the crack detector in advance.

In addition, inorganic layers may be deposited up to an end of a substrate that is a cutting line of a mother substrate to thereby prevent deterioration of the display apparatus by reducing intrusion of external impurities, such as moisture, etc. into a side of the substrate.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate;
   a display area arranged on the substrate and comprising a plurality of pixels, and a peripheral area arranged outside the display area;
   a first dam arranged on the peripheral area;
   a peripheral crack detection circuit arranged between the first dam and an end of the substrate;
   a second dam arranged between the first dam and the end of the substrate; and
   an encapsulation layer comprising a first inorganic layer, an organic layer, and a second inorganic layer, each covering the display area and a portion of the peripheral area,
   wherein:
   the peripheral crack detection circuit comprises a plurality of crack detection wires arranged on a same layer; and
   at least a portion of the second dam is arranged between the peripheral crack detection circuit and the end of the substrate.

2. The display apparatus of claim 1, wherein the second dam is arranged to overlap the peripheral crack detection circuit.

3. The display apparatus of claim 1, further comprising a first insulating layer in the display area and the peripheral area,
   wherein the peripheral crack detection circuit is arranged over a first insulating layer in the peripheral area.

4. The display apparatus of claim 3, wherein the second dam comprises at least one slit in the first insulating layer, and a cladding covering the at least one slit.

5. The display apparatus of claim 3, further comprising a first barrier layer arranged between the substrate and the first insulating layer.

6. The display apparatus of claim 5, wherein the first barrier layer extends to the end of the substrate.

7. The display apparatus of claim 6, wherein the first inorganic layer in the encapsulation layer is in direct contact with the first barrier layer between the peripheral crack detection circuit and the end of the substrate.

8. The display apparatus of claim 6, wherein the first inorganic layer in the encapsulation layer is in direct contact with the first barrier layer between the second dam and the end of the substrate.

9. The display apparatus of claim 1, further comprising a first insulating layer in the display area and the peripheral area,
wherein:
at least one slit is arranged in the first insulating layer in the peripheral area; and
the peripheral crack detection circuit is arranged in the at least one slit in the first insulating layer.

10. The display apparatus of claim 1, wherein the substrate comprises a flexible material.

11. The display apparatus of claim 10, wherein the substrate further comprises:
a first layer comprising an organic material;
a second layer comprising an organic material; and
a second barrier layer disposed between the first layer and the second layer.

12. The display apparatus of claim 1, further comprising:
a thin-film transistor arranged on the substrate and comprising an active layer, a gate electrode, a source electrode, and a drain electrode;
a first electrode connected to one of the source electrode and the drain electrode;
a pixel-defining layer defining the first electrode;
a second electrode facing the first electrode; and
an intermediate layer arranged between the first electrode and the second electrode and comprising an organic light-emitting layer,
wherein:
the display apparatus further comprises a first insulating layer in the display area and the peripheral area; and
the first insulating layer comprises at least one of insulating layers arranged between the active layer, the gate electrode, the source electrode, and the drain electrode in the thin-film transistor.

13. The display apparatus of claim 12, further comprising a passivation layer on the source electrode and the drain electrode,
wherein:
the second dam comprises at least one slit in the first insulating layer, and a cladding covering the at least one slit; and
the cladding includes a same material as a material of the passivation layer.

14. The display apparatus of claim 13, wherein the first dam includes a same material as a material of at least one of the passivation layer and the pixel-defining layer.

15. The display apparatus of claim 14, wherein the first dam comprises a first first dam arranged near the display area, and a first second dam arranged between the first first dam and the peripheral crack detection circuit.

16. The display apparatus of claim 15, further comprising a spacer on the pixel-defining layer,
wherein an uppermost portion of the first second dam includes a same material as a material of the spacer.

17. A display apparatus comprising:
a substrate;
a display area arranged on the substrate and comprising a plurality of pixels, and a peripheral area arranged outside the display area;
a first dam arranged on the peripheral area;
a peripheral crack detection circuit arranged between the first dam and an end of the substrate;
a second dam arranged between the first dam and the end of the substrate;
a power supply line arranged between the display area and the peripheral crack detection circuit; and
an encapsulation layer covering the display area and a portion of the peripheral area,
wherein:
each of the plurality of pixels comprises a first electrode, a second electrode, and an intermediate layer arranged between the first electrode and the second electrode and comprising an organic light-emitting layer;
the power supply line is electrically connected to the second electrode via an opening defined in an insulating layer arranged between the power supply line and the second electrode;
the peripheral crack detection circuit comprises a plurality of crack detection wires arranged on a same layer; and
at least a portion of the second dam is arranged between the peripheral crack detection circuit and the end of the substrate.

18. The display apparatus of claim 17, wherein the first dam overlaps a portion of the power supply line.

19. The display apparatus of claim 17, wherein the power supply line and the peripheral crack detection circuit are spaced apart from each other.

* * * * *